(12) United States Patent
Tanaka

(10) Patent No.: US 11,395,993 B2
(45) Date of Patent: Jul. 26, 2022

(54) PROCESSING LIQUID GENERATION METHOD, PROCESSING LIQUID GENERATION MECHANISM, SEMICONDUCTOR MANUFACTURING APPARATUS, AND SEMICONDUCTOR MANUFACTURING METHOD

(71) Applicant: Mitsubishi Electric Corporation, Tokyo (JP)

(72) Inventor: Hiroshi Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 228 days.

(21) Appl. No.: 16/886,299

(22) Filed: May 28, 2020

(65) Prior Publication Data

US 2021/0086146 A1    Mar. 25, 2021

(30) Foreign Application Priority Data

Sep. 20, 2019    (JP) ............................. JP2019-171098

(51) Int. Cl.
     *F17D 1/17*        (2006.01)
     *B01F 23/45*      (2022.01)
     (Continued)

(52) U.S. Cl.
     CPC ...... *B01F 23/452* (2022.01); *H01L 21/67051* (2013.01); *B01F 23/405* (2022.01);
     (Continued)

(58) Field of Classification Search
     CPC ...... B01F 23/452; B01F 23/45; B01F 23/405; B01F 35/833; H01L 21/67051;
     (Continued)

(56) References Cited

U.S. PATENT DOCUMENTS 5,873,380 A * 2/1999   Kanno ............... H01L 21/67051
                                                   134/102.1
7,946,751 B2 * 5/2011   Niermeyer ............. G05D 11/16
                                                    366/160.1
(Continued)

FOREIGN PATENT DOCUMENTS

CN        101009206 A    8/2007
JP        S6292326 A     4/1987
(Continued)

OTHER PUBLICATIONS

An Office Action mailed by China National Intellectual Property Administration dated Mar. 7, 2022, which corresponds to Chinese Patent Application No. 202010967568.6 and is related to U.S. Appl. No. 16/886,299; with English language translation.

(Continued)

*Primary Examiner* — Minh Q Le
(74) *Attorney, Agent, or Firm* — Studebaker & Brackett PC

(57) ABSTRACT

A droplet dispersion mechanism performs a first droplet generation process of supplying gas to a chemical liquid, and dispersing the chemical liquid into droplets to acquire chemical liquid droplets. A droplet dispersion mechanism performs a second droplet generation process of supplying gas to a chemical liquid, and dispersing the chemical liquid into droplets to acquire chemical liquid droplets. A droplet mixing mechanism performs a droplet mixing process of mixing the chemical liquid droplets and the chemical liquid droplets to acquire a processing liquid in a form of droplets. A discharge nozzle performs a discharge process of externally discharging the processing liquid received from the droplet mixing mechanism.

9 Claims, 7 Drawing Sheets

(51) Int. Cl.
*H01L 21/67* (2006.01)
*B01F 23/40* (2022.01)
*B01F 35/88* (2022.01)

(52) U.S. Cl.
CPC ............. *B01F 23/45* (2022.01); *B01F 35/883* (2022.01); *H01L 21/6708* (2013.01); *H01L 21/6715* (2013.01); *H01L 21/67017* (2013.01); *H01L 21/67253* (2013.01)

(58) Field of Classification Search
CPC ......... H01L 21/67017; H01L 21/67253; H01L 21/6708; H01L 21/6715
USPC .................. 137/3; 134/198; 156/345.33, 756
See application file for complete search history.

(56) References Cited

U.S. PATENT DOCUMENTS

| | | | |
|---|---|---|---|
| 9,395,342 B2 * | 7/2016 | Okamoto | G01N 33/004 |
| 2002/0063169 A1 * | 5/2002 | Verhaverbeke | H01L 21/67051 239/440 |
| 2003/0089799 A1 * | 5/2003 | Kanno | H01L 21/67051 239/434 |
| 2004/0261817 A1 | 12/2004 | Araki et al. | |
| 2007/0068558 A1 * | 3/2007 | Papanu | G03F 1/82 134/29 |
| 2007/0169793 A1 * | 7/2007 | Shimada | H01L 21/67051 134/26 |
| 2007/0261716 A1 * | 11/2007 | Franklin | B08B 3/02 134/198 |
| 2008/0006303 A1 * | 1/2008 | Butterbaugh | B08B 3/02 134/34 |
| 2008/0163891 A1 * | 7/2008 | Tang | H01L 21/02057 134/198 |
| 2008/0173327 A1 * | 7/2008 | Miyagi | B05B 7/0433 204/661 |
| 2008/0230632 A1 * | 9/2008 | Fenton | B05B 7/0483 239/11 |
| 2009/0317504 A1 * | 12/2009 | Rajala | B01J 2/04 977/773 |
| 2011/0048471 A1 * | 3/2011 | Kikuchi | H01L 21/67051 134/198 |
| 2011/0098465 A1 * | 4/2011 | Ball | B01F 25/10 536/122 |
| 2012/0325927 A1 * | 12/2012 | Tokoshima | H01L 21/02052 239/8 |
| 2013/0008470 A1 * | 1/2013 | Dobashi | H01L 21/0206 134/21 |
| 2013/0052360 A1 * | 2/2013 | Maegawa | B05C 11/08 118/612 |
| 2013/0220368 A1 * | 8/2013 | Ishibashi | H01L 21/6715 134/6 |
| 2014/0261572 A1 * | 9/2014 | Sotoku | H01L 21/67028 134/33 |
| 2015/0144164 A1 * | 5/2015 | Ishibashi | H01L 21/67051 134/102.1 |
| 2016/0001243 A1 * | 1/2016 | Waizenauer | B01F 23/405 366/151.1 |
| 2017/0186599 A1 * | 6/2017 | Takahashi | H01L 21/30604 |
| 2017/0323809 A1 * | 11/2017 | Fukaya | H01L 21/67017 |
| 2020/0135448 A1 * | 4/2020 | Tanaka | H01L 21/461 |

FOREIGN PATENT DOCUMENTS

| | | |
|---|---|---|
| JP | 2003-092283 A | 3/2003 |
| JP | 2005039205 A | 2/2005 |
| JP | 2014-107353 A | 6/2014 |

OTHER PUBLICATIONS

An Office Action issued by the German Patent Office dated Apr. 8, 2022, which corresponds to German Patent Application No. 10 2020 123 488.0 and is related to U.S. Appl. No. 16/886,299 with English language translation.

* cited by examiner

PROCESSING LIQUID GENERATION METHOD, PROCESSING LIQUID GENERATION MECHANISM, SEMICONDUCTOR MANUFACTURING APPARATUS, AND SEMICONDUCTOR MANUFACTURING METHOD

BACKGROUND OF THE INVENTION

Field of the Invention

The present invention relates to a processing liquid generation method and a processing liquid generation mechanism to mix at least a first chemical liquid and a second chemical liquid to generate a processing liquid in a form of droplets, and further relates to a semiconductor manufacturing apparatus utilizing the processing liquid generation mechanism and a semiconductor manufacturing method utilizing the processing liquid generation method.

Description of the Background Art

As a processing liquid generation mechanism to mix two chemical liquids to acquire a processing liquid in a form of droplets, Japanese Patent Application Laid-Open No. 2005-39205 discloses a foreign matter removing apparatus, for example.

The foreign matter removing apparatus mixes two chemical liquids to acquire a mixed chemical liquid in a liquid form, and then disperses the mixed chemical liquid using gas to eventually generate a processing liquid in a form of droplets for use in removal of foreign matter on a substrate.

In a processing liquid generation method performed using the conventional foreign matter removing apparatus disclosed in Japanese Patent Application Laid-Open No. 2005-39205, the two chemical liquids are mixed by a chemical liquid mixer to generate the mixed chemical liquid in the liquid form at a stage before acquisition of the processing liquid. When the mixed chemical liquid is acquired, a stirrer is further added after the chemical liquid mixer to secure uniformity of mixture of the two chemical liquids.

The need for addition of the stirrer necessitates an increase in length of piping to acquire the mixed chemical liquid. On the other hand, it is desirable that the processing liquid in the form of droplets have a higher temperature to secure high reactivity.

Due to the increase in length of the piping to acquire the mixed chemical liquid, however, heat of reaction generated by mixing the two chemical liquids is dissipated wastefully when the mixed chemical liquid flows through the piping. As described above, the temperature is reduced by heat dissipation at a stage of the mixed chemical liquid before generation of the processing liquid in the form of droplets. When the mixed chemical liquid after all the heat of reaction is released is dispersed, using gas, into droplets by a two-fluid nozzle as a processing liquid generation mechanism, the mixed chemical liquid is exposed to a large amount of gas before joining a flow of the gas, and the temperature of the droplets is almost acclimatized to the temperature of the gas. To accelerate reaction through an increase in temperature, it is necessary to set the temperature of the gas to a high temperature required in a processing condition. With increasing temperature of the gas, the number of choices of a structural material having both heat resistance and chemical resistance decreases, and it becomes necessary to introduce an expensive material.

SUMMARY

It is an object to acquire a processing liquid generation method and a processing liquid generation mechanism to generate a processing liquid having high reactivity.

A processing liquid generation method in the present invention includes a first droplet generation process, a second droplet generation process, and a droplet mixing process.

The first droplet generation process is a process of generating droplets of a first chemical liquid to acquire first chemical liquid droplets, and the second droplet generation process is a process of generating droplets of a second chemical liquid to acquire second chemical liquid droplets.

The droplet mixing process is a process of mixing at least the first chemical liquid droplets and the second chemical liquid droplets to acquire a processing liquid in a form of droplets.

In the processing liquid generation method in the present invention, the first chemical liquid droplets and the second chemical liquid droplets are instantaneously and closely mixed together during performance of the droplet mixing process. The first chemical liquid droplets and the second chemical liquid droplets mixed together are fine and have a small thermal capacity, so that the temperature thereof increases rapidly. As the temperature increases in a short time, the length of piping required to perform the droplet mixing process can be made relatively short, and thus reduction in reactivity due to heat dissipation from the piping can be suppressed.

The processing liquid generation method in the present invention can thus make the length of the piping required to perform the droplet mixing process relatively short to thereby generate the processing liquid having high reactivity.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 7:
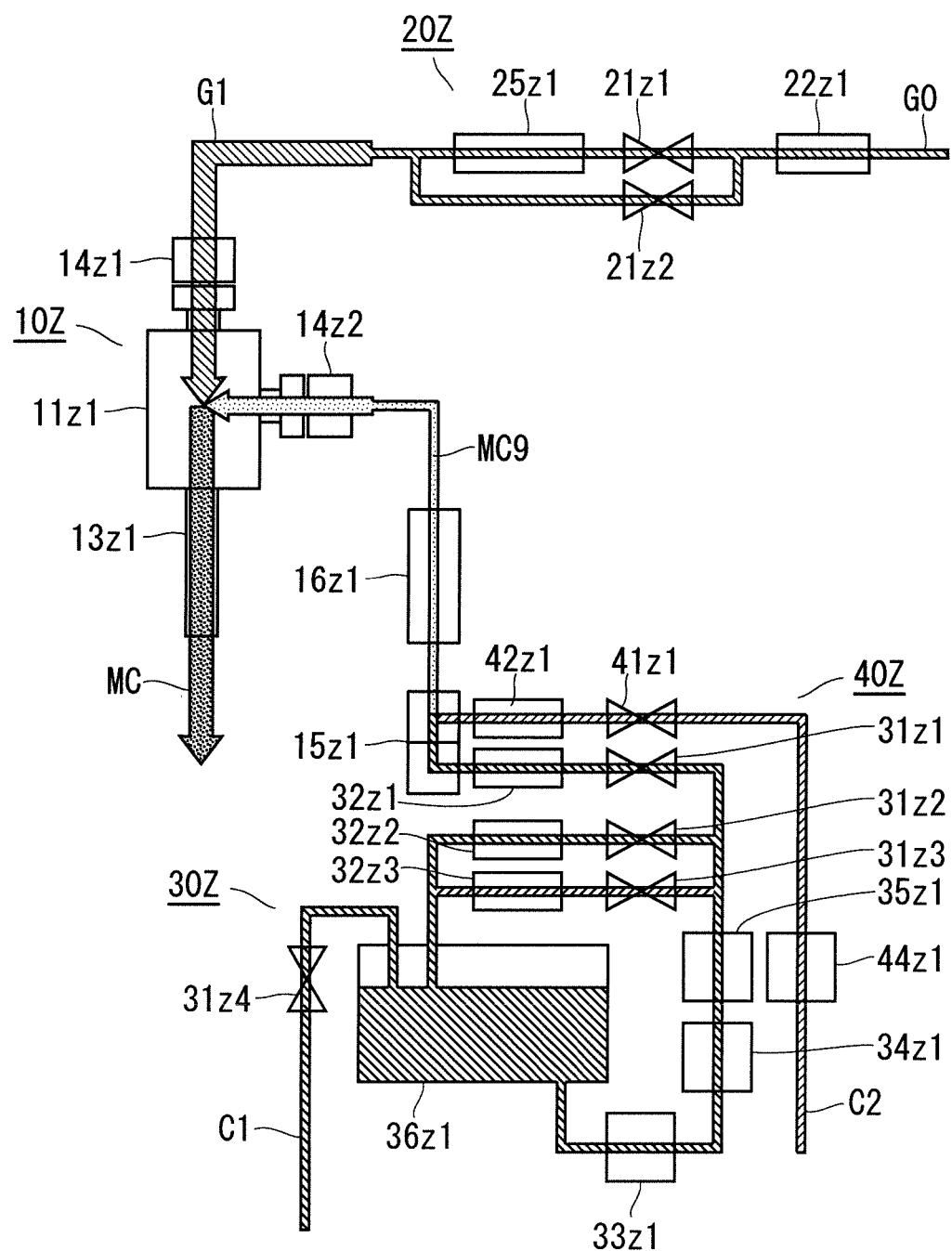
FIG. 7 schematically illustrates an internal configuration of a processing liquid generation mechanism as a comparative technique.

<Comparative Technique>
FIG. 7 schematically illustrates internal configurations of a processing liquid generation mechanism as a comparative technique and peripherals thereof included in a foreign matter removing apparatus disclosed in Japanese Patent Application Laid-Open No. 2005-39205. Hereinafter, the processing liquid generation mechanism illustrated in FIG. 7 will be described as the comparative technique relative to processing liquid generation mechanisms 10A to 10C, which will be described below.

As illustrated in FIG. 7, an overall configuration including a processing liquid generation mechanism 10Z as the comparative technique includes the processing liquid generation mechanism 10Z, a gas supply mechanism 20Z, a circulating temperature regulation supply mechanism 30Z, and a chemical liquid supply mechanism 40Z as main components.

These main components are connected by piping, which is not illustrated. In FIG. 7, flows of gas G0, gas G1, a chemical liquid C1, a chemical liquid C2, a mixed chemical liquid MC9, a processing liquid MC, and the like, which will be described below, are illustrated to omit illustration of the piping for purposes of explanation.

The processing liquid generation mechanism 10Z includes a droplet dispersion mechanism 11$z$1, a discharge nozzle 13$z$1, a joint 14$z$1, a joint 14$z$2, a chemical liquid mixer 15$z$1, and a stirrer 16$z$1 as main components. A portion expressed as a two-fluid nozzle in the comparative technique includes the droplet dispersion mechanism 11$z$1, the discharge nozzle 13$z$1, the joint 14$z$1, and the joint 14$z$2.

The gas supply mechanism 20Z includes a flow rate regulator 22$z$1, a valve 21$z$1, a valve 21$z$2, and a temperature regulator 25$z$1 as main components.

The circulating temperature regulation supply mechanism 30Z includes valves 31$z$1 to 31$z$4, flow rate regulators 32$z$1 to 32$z$3, a pump 33$z$1, a filter 34$z$1, a temperature regulator 35$z$1, and a tank 36$z$1 as main components.

The chemical liquid supply mechanism 40Z includes a valve 41$z$1, a flow rate regulator 42$z$1, and a filter 44$z$1 as main components.

To the processing liquid generation mechanism 10Z, the gas G1 is supplied from the gas supply mechanism 20Z, and the chemical liquid C1 and the chemical liquid C2 are supplied respectively from the circulating temperature regulation supply mechanism 30Z and the chemical liquid supply mechanism 40Z.

In the gas supply mechanism 20Z, the gas G0 is supplied to the flow rate regulator 22$z$1. When the valve 21$z$1 is opened and the valve 21$z$2 is closed, the gas G0 passes through the flow rate regulator 22$z$1 and the temperature regulator 25$z$1, so that the gas G1 having undergone flow rate regulation and temperature regulation is acquired.

On the other hand, when the valve 21$z$1 is closed and the valve 21$z$2 is opened, the gas G1 having a room temperature having passed through only the flow rate regulator 22$z$1 is acquired. That is to say, the gas G1 having undergone only flow rate regulation is supplied to the droplet dispersion mechanism 11$z$1 of the processing liquid generation mechanism 10Z.

In the circulating temperature regulation supply mechanism 30Z, the chemical liquid C1 is stored in the tank 36$z$1 while being regulated to have a required temperature, and a temperature variation is suppressed through circulation. Specifically, the valve 31$z$3 is opened, and the chemical liquid C1 in the tank 36$z$1 is returned to the tank 36$z$1 by the pump 33$z$1 through the filter 34$z$1, the temperature regulator 35$z$1, the valve 31$z$3, and the flow rate regulator 32$z$3, to thereby achieve temperature regulation of the chemical liquid C1. The temperature of the chemical liquid C1 is directly regulated by the temperature regulator 35$z$1.

The valve 31$z$1 and the valve 31$z$2 perform exclusive operations. When the chemical liquid C1 is supplied to the chemical liquid mixer 15$z$1, the valve 31$z$1 is opened and the valve 31$z$2 is closed. In the other cases, the valve 31$z$1 is closed and the valve 31$z$2 is opened.

Flow rate settings of the flow rate regulator 32$z$1 and the flow rate regulator 32$z$2 are equalized to suppress a variation in circulating flow rate at opening and closing switching between the valve 31$z$1 and the valve 31$z$2. When there are a plurality of supply systems, an equivalent of a combination of the flow rate regulator 32$z$1 and the flow rate regulator 32$z$2 is provided for each of the supply systems, and mutual interference among the supply systems can be suppressed. When the chemical liquid C1 in the tank 36$z$1 is reduced, the valve 31$z$4 is opened to refill the tank 36$z$1 with the chemical liquid C1 in an undiluted form.

In the chemical liquid supply mechanism 40Z, the chemical liquid C2 in an undiluted form can be supplied through the filter 44$z$1 and the flow rate regulator 42$z$1 to the chemical liquid mixer 15$z$1 by opening the valve 41$z$1.

The chemical liquid mixer 15$z$1 of the processing liquid generation mechanism 10Z mixes the chemical liquid C1 and the chemical liquid C2 as supplied in a liquid form, but merely joins flow paths of the chemical liquid C1 and the chemical liquid C2, so that the chemical liquid mixer 15$z$1 itself has a low stirring capability, and provides insufficient uniformity of mixture. The stirrer 16$z$1 is thus added after the chemical liquid mixer 15$z$1 to secure uniformity of mixture of the chemical liquid C1 and the chemical liquid C2 as the mixed chemical liquid MC9.

The mixed chemical liquid MC9 having passed through the stirrer 16$z$1 is supplied to the droplet dispersion mechanism 11$z$1 of the processing liquid generation mechanism 10Z.

In the droplet dispersion mechanism 11$z$1, the mixed chemical liquid MC9 is dispersed into droplets using the gas G1 to generate the processing liquid MC in a form of droplets. The generated processing liquid MC is externally discharged through the discharge nozzle 13$z$1.

In the comparative technique having such a configuration, a case where the processing liquid MC for use in resist removal is generated using sulfuric acid ($H_2SO_4$) as the chemical liquid C1 and aqueous hydrogen peroxide ($H_2O_2$) as the chemical liquid C2 is considered.

In this case, considered is a method of supplying the sulfuric acid ($H_2SO_4$) having been regulated by the temperature regulator 35$z$1 to have a temperature of approximately 90° C. and supplying the aqueous hydrogen peroxide ($H_2O_2$) directly from a container, such as a chemical supply tank and a canister, installed at the room temperature.

In the comparative technique, the valve 21$z$1 is opened and the valve 21$z$2 is closed in the gas supply mechanism 20Z to perform temperature regulation so that the gas G1 has a temperature of 130° C. or more, for example, through heating by the temperature regulator 25$z$1.

In this case, the gas has a temperature equivalent to the temperature of approximately 130° C. that the mixed chemical liquid of the sulfuric acid ($H_2SO_4$) and the aqueous hydrogen peroxide ($H_2O_2$) is to reach.

An appropriate condition required for the processing liquid MC is high reactivity secured under high temperature in a state of generating a high concentration of persulfuric acid (Caro's acid) ($H_2SO_5$) through mixture.

In the above-mentioned comparative technique, however, the chemical liquid C1 and the chemical liquid C2 are mixed in the liquid form to acquire the mixed chemical liquid MC9. Any measures, such as addition of the stirrer 16$z$1 after the chemical liquid mixer 15z1, are required to secure uniformity of mixture of the mixed chemical liquid MC9.

The above-mentioned measures necessitate an increase in length of piping through which the mixed chemical liquid MC9 flows to wastefully dissipate heat of reaction of the sulfuric acid ($H_2SO_4$) and the aqueous hydrogen peroxide ($H_2O_2$) used to increase the temperature from the piping having a relatively long length. Although it is necessary to secure high reactivity of the processing liquid MC in the form of droplets through an increase in temperature of the mixed chemical liquid MC9, heat dissipation from the piping through which the mixed chemical liquid MC9 flows can cause reduction in reactivity of the processing liquid MC in the form of droplets. In a case where the processing liquid MC is for use in resist removal, for example, reduction in resist removal capability can be caused.

The droplet dispersion mechanism 11z1 disperses the mixed chemical liquid MC9 after all the heat of reaction is released into droplets using the gas G1. The mixed chemical liquid MC9 is thus exposed to a large amount of the gas G1 before joining a flow of the gas G1, and the temperature of the processing liquid MC in the form of droplets is almost acclimatized to the temperature of the gas G1. It is thus necessary to set the temperature of the gas G1 to a high temperature required in a processing condition to secure high reactivity of the processing liquid MC in the form of droplets.

In a case where the gas G1 has a high temperature, however, it is necessary to choose, in accordance with a degree of the increase in temperature, a structural material having both heat resistance and chemical resistance for flow paths in the gas supply mechanism 20Z and the processing liquid generation mechanism 10Z. This causes a problem in that the number of choices of a structural material for the flow paths corresponding to the chemical liquid C1 and the chemical liquid C2 decreases, and introduction of an expensive structural material, such as SiC to be used in a fluoroplastic portion having an insufficient strength, becomes necessary.

A processing liquid generation mechanism and a processing liquid generation method will be described in embodiments below to solve the above-mentioned problem caused in the comparative technique.

Embodiment 1

(Basic Configuration)

Figure 1:
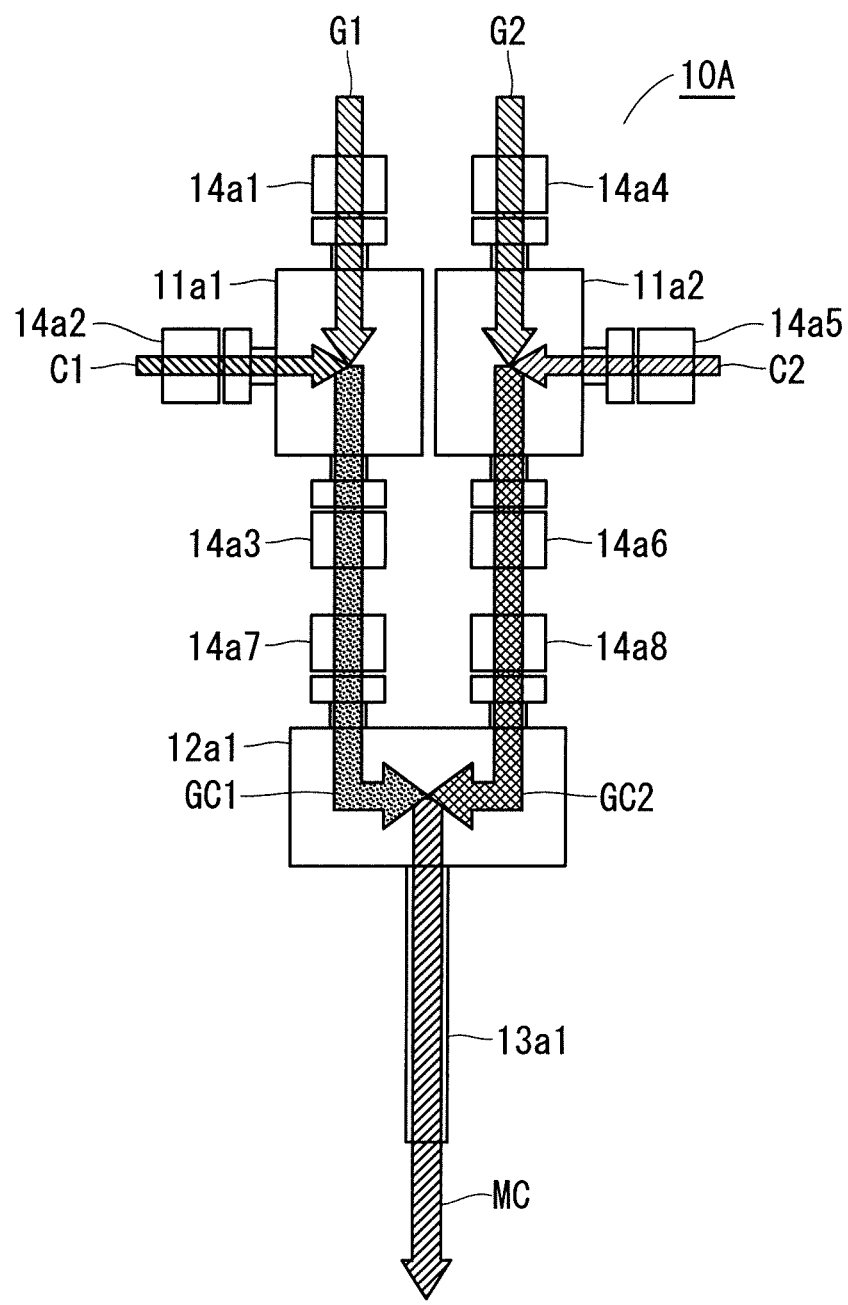
FIG. 1 illustrates an internal configuration of a processing liquid generation mechanism as a basic configuration in Embodiment 1.

FIG. 1 illustrates an internal configuration of the processing liquid generation mechanism 10A as a basic configuration in Embodiment 1.

The processing liquid generation mechanism 10A includes a droplet dispersion mechanism 11a1, a droplet dispersion mechanism 11a2, a droplet mixing mechanism 12a1, a discharge nozzle 13a1, and joints 14a1 to 14a8 as main components.

These main components are connected directly or by piping, which is not illustrated. In FIG. 1, flows of the gas G1, gas G2, the chemical liquid C1, the chemical liquid C2, chemical liquid droplets GC1, chemical liquid droplets GC2, the processing liquid MC, and the like, which will be described below, are illustrated to omit illustration of the piping for purposes of explanation.

The droplet dispersion mechanism 11a1 as a first droplet dispersion mechanism performs a first droplet generation process of supplying the gas G1 as first gas to the chemical liquid C1 as a first chemical liquid, and dispersing the chemical liquid C1 into droplets to acquire the chemical liquid droplets GC1 as first chemical liquid droplets.

The gas G1 is supplied to an interior of the droplet dispersion mechanism 11a1 through the joint 14a1, the chemical liquid C1 is supplied to the interior of the droplet dispersion mechanism 11a1 through the joint 14a2, and the chemical liquid droplets GC1 are supplied to the droplet mixing mechanism 12a1 through the joint 14a3 and the joint 14a7.

The droplet dispersion mechanism 11a2 as a second droplet dispersion mechanism performs a second droplet generation process of supplying the gas G2 as second gas to the chemical liquid C2 as a second chemical liquid, and dispersing the chemical liquid C2 into droplets to acquire the chemical liquid droplets GC2 as second chemical liquid droplets.

The gas G2 is supplied to an interior of the droplet dispersion mechanism 11a2 through the joint 14a4, the chemical liquid C2 is supplied to the interior of the droplet dispersion mechanism 11a2 through the joint 14a5, and the chemical liquid droplets GC2 are supplied to the droplet mixing mechanism 12a1 through the joint 14a6 and the joint 14a8.

The droplet mixing mechanism 12a1 performs a droplet mixing process of mixing the chemical liquid droplets GC1 and the chemical liquid droplets GC2 to acquire the processing liquid MC in the form of droplets.

The discharge nozzle 13a1 performs a discharge process of externally discharging the processing liquid MC received from the droplet mixing mechanism 12a1.

In the processing liquid generation method performed using the above-mentioned processing liquid generation mechanism 10A, the droplet mixing process is performed by the droplet mixing mechanism 12a1 to be continuous with the first droplet generation process and the second droplet generation process performed respectively by the droplet dispersion mechanism 11a1 and the droplet dispersion mechanism 11a2 to thereby generate the processing liquid MC in the form of droplets.

As described above, in the processing liquid generation mechanism 10A as the basic configuration in Embodiment 1, the chemical liquid droplets GC1 and the chemical liquid droplets GC2 acquired respectively by the droplet dispersion mechanism 11a1 and the droplet dispersion mechanism 11a2 have been dispersed into fine droplets, and are joining the flows of the gas G1 and the gas G2. The chemical liquid droplets GC1 and the chemical liquid droplets GC2 are thus instantaneously and closely mixed together in a relatively short time during performance of the droplet mixing process by the droplet mixing mechanism 12a1. The temperature of the droplets having a small thermal capacity increases rapidly due to heat of reaction. That is to say, the length of piping from the droplet mixing mechanism 12a1 to the discharge nozzle 13a1 can be made relatively short, and thus reduction in reactivity due to heat dissipation from the piping can be suppressed. On the other hand, the generated processing liquid MC in the form of droplets is joining a flow of a mixed gas, and is thus thermally insulated by the surrounding gas. Heat dissipation is moderate even if the gas has a lower temperature than the generated processing liquid MC in the form of droplets. The processing liquid MC in the form of droplets in an appropriate condition in which high reactivity is secured by the increase in temperature becomes available.

According to the processing liquid generation method performed using the processing liquid generation mechanism 10A, a processing liquid generation method for suppressing reduction in reactivity of the processing liquid MC and setting the temperature of the gas G1 and the gas G2 used for dispersion into droplets to a temperature lower than the temperature required in the processing condition can be achieved to secure high reactivity of the processing liquid MC to thereby reduce a processing time. In a case where the processing liquid MC is for use in resist removal, for example, a high resist removal capability can be maintained. Furthermore, a semiconductor manufacturing apparatus utilizing the processing liquid generation mechanism 10A is expected to have an improved production capability.

(Processing Liquid Generation Method)

FIG. 2 illustrates internal configurations of the processing liquid generation mechanism 10B in Embodiment 1 and peripherals thereof. The processing liquid generation mechanism 10B and the processing liquid generation mechanism 10A have a common basic configuration and common basic operation, and, in view of practicality, the processing liquid generation mechanism 10B further has an integrated configuration as developed from the processing liquid generation mechanism 10A.

Specifically, the droplet dispersion mechanism 11*a*1 and a droplet dispersion mechanism 11*b*1, the droplet dispersion mechanism 11*a*2 and a droplet dispersion mechanism 11*b*2, the droplet mixing mechanism 12*a*1 and a droplet mixing mechanism 12*b*1, and the discharge nozzle 13*a*1 and a discharge nozzle 13*b*1 are each equivalent to each other. For example, the droplet mixing mechanism 12*a*1 and the droplet mixing mechanism 12*b*1 perform substantially the same droplet mixing process.

An overall configuration including the processing liquid generation mechanism 10B in Embodiment 1 includes the processing liquid generation mechanism 10B, a gas supply mechanism 20B, a circulating temperature regulation supply mechanism 30B, and a chemical liquid supply mechanism 40B as main components.

These main components are connected by piping, which is not illustrated. In FIG. 2, flows of the gas G0, the gas G1, the gas G2, the chemical liquid C1, the chemical liquid C2, the chemical liquid droplets GC1, the chemical liquid droplets GC2, the processing liquid MC, and the like, which will be described below, are illustrated to omit illustration of the piping for purposes of explanation.

The processing liquid generation mechanism 10B includes the droplet dispersion mechanism 11*b*1, the droplet dispersion mechanism 11*b*2, the droplet mixing mechanism 12*b*1, the discharge nozzle 13*b*1, and joints 14*b*1 to 14*b*4 as main components.

The processing liquid generation mechanism 10B has a structure in which the droplet dispersion mechanism 11*b*1, the droplet dispersion mechanism 11*b*2, the droplet mixing mechanism 12*b*1, the discharge nozzle 13*b*1, and the joints 14*b*1 to 14*b*4 are integrated with one another.

The droplet dispersion mechanism 11*b*1 as the first droplet dispersion mechanism performs the first droplet generation process of supplying the gas G1 as the first gas to the chemical liquid C1 as the first chemical liquid, and dispersing the chemical liquid C1 into droplets to acquire the chemical liquid droplets GC1 as the first chemical liquid droplets.

The gas G1 is supplied to an interior of the droplet dispersion mechanism 11*b*1 through the joint 14*b*1, the chemical liquid C1 is supplied to the interior of the droplet dispersion mechanism 11*b*1 through the joint 14*b*2, and the chemical liquid droplets GC1 are supplied to the droplet mixing mechanism 12*b*1 within the above-mentioned structure.

The droplet dispersion mechanism 11*b*2 as the second droplet dispersion mechanism performs the second droplet generation process of supplying the gas G2 as the second gas to the chemical liquid C2 as the second chemical liquid, and dispersing the chemical liquid C2 into droplets to acquire the chemical liquid droplets GC2 as the second chemical liquid droplets.

The gas G2 is supplied to an interior of the droplet dispersion mechanism 11*b*2 through the joint 14*b*3, the chemical liquid C2 is supplied to the interior of the droplet dispersion mechanism 11*b*2 through the joint 14*b*4, and the chemical liquid droplets GC2 are supplied to the droplet mixing mechanism 12*b*1 within the above-mentioned structure.

The droplet mixing mechanism 12*b*1 performs the droplet mixing process of mixing the chemical liquid droplets GC1 and the chemical liquid droplets GC2 to acquire the processing liquid MC in the form of droplets.

The discharge nozzle 13*b*1 performs the discharge process of externally discharging the processing liquid MC received from the droplet mixing mechanism 12*b*1.

The gas supply mechanism 20B includes a valve 21*b*1, a valve 21*b*2, a flow rate regulator 22*b*1, a flow rate regulator 22*b*2, and a temperature regulator 25*b*1 as main components.

The circulating temperature regulation supply mechanism 30B includes valves 31*b*1 to 31*b*4, flow rate regulators 32*b*1 to 32*b*3, a pump 33*b*1, a filter 34*b*1, a temperature regulator 35*b*1, and a tank 36*b*1 as main components.

The chemical liquid supply mechanism 40B includes a valve 41*b*1, a flow rate regulator 42*b*1, and a filter 44*b*1 as main components.

To the processing liquid generation mechanism 10B, the gas G1 and the gas G2 are supplied from the gas supply mechanism 20B, and the chemical liquid C1 and the chemical liquid C2 are supplied respectively from the circulating temperature regulation supply mechanism 30B and the chemical liquid supply mechanism 40B.

In the gas supply mechanism 20B, the valve 21*b*1 and the temperature regulator 25*b*1 are provided, between the gas G0 to be supplied and an intermediate point P20, parallel to the valve 21*b*2. A portion from the intermediate point P20 to the processing liquid generation mechanism 10B is connected to the joint 14*b*1 through the flow rate regulator 22*b*1, and is further connected to the joint 14*b*3 through the flow rate regulator 22*b*2.

When the valve 21*b*1 is opened and the valve 21*b*2 is closed in the gas supply mechanism 20B having such a configuration, the gas G0 passes through the temperature regulator 25*b*1, so that the gas G0 having undergone temperature regulation is acquired at the intermediate point P20.

On the other hand, when the valve 21*b*1 is closed and the valve 21*b*2 is opened, the gas G0 is supplied to the intermediate point P20 while maintaining the room temperature without undergoing temperature regulation.

The gas G0 from the intermediate point P20 is supplied to the droplet dispersion mechanism 11*b*1 through the joint 14*b*1 as the gas G1 having passed through the flow rate regulator 22*b*1, and is further supplied to the droplet dispersion mechanism 11*b*2 through the joint 14*b*3 as the gas G2 having passed through the flow rate regulator 22112.

That is to say, the gas G0 is supplied to the valve 21*b*1 and the valve 21*b*2. When the valve 21*b*1 is opened and the valve 21*b*2 is closed, the gas G1 having undergone temperature regulation and flow rate regulation is acquired by the gas G0 passing through the temperature regulator 25*b*1 and the flow rate regulator 22*b*1, and the gas G2 having undergone temperature regulation and flow rate regulation is acquired by the gas G0 passing through the temperature regulator 25*b*1 and the flow rate regulator 22*b*2.

On the other hand, when the valve 21*b*1 is closed and the valve 21*b*2 is opened, the gas G1 having the room temperature having undergone only flow rate regulation is acquired by the gas G0 passing through only the flow rate regulator 22*b*1, and the gas G2 having the room temperature having undergone only flow rate regulation is acquired by the gas G0 passing through only the flow rate regulator 22*b*2.

In the circulating temperature regulation supply mechanism 30B, the chemical liquid C1 is stored in the tank 36*b*1 while being regulated to have a temperature set for a recipe, and a temperature variation is suppressed through circulation. Specifically, the valve 31*b*3 is opened, and the chemical liquid C1 in the tank 36*b*1 is returned to the tank 36*b*1 by the pump 33*b*1 through the filter 34*b*1, the temperature regulator 35*b*1, the valve 31*b*3, and the flow rate regulator 32*b*3, to thereby achieve temperature regulation of the chemical liquid C1. The temperature of the chemical liquid C1 is directly regulated by the temperature regulator 35*b*1.

The valve 31*b*1 and the valve 31*b*2 perform exclusive operations. When the chemical liquid C1 is supplied to the droplet dispersion mechanism 11*b*1, the valve 31*b*1 is opened and the valve 31*b*2 is closed. In the other cases, the valve 31*b*1 is closed and the valve 31*b*2 is opened.

When the valve 31*b*1 is opened, the chemical liquid C1 is supplied to the droplet dispersion mechanism 11*b*1 through the valve 31*b*1, the flow rate regulator 32*b*1, and the joint 14*b*2.

Flow rate settings of the flow rate regulator 32*b*1 and the flow rate regulator 32*b*2 are equalized to suppress a variation in circulating flow rate at opening and closing switching between the valve 31*b*1 and the valve 31*b*2. When there are a plurality of supply systems, an equivalent of a combination of the flow rate regulator 32*b*1 and the flow rate regulator 32*b*2 is provided for each of the supply systems, and mutual interference among the supply systems can be suppressed. When the chemical liquid C1 in the tank 36*b*1 is reduced, the valve 31*b*4 is opened to refill the tank 36*b*1 with the chemical liquid C1 in the undiluted form.

In the chemical liquid supply mechanism 40B, the chemical liquid C2 in the undiluted form can be supplied through the filter 44*b*1, the valve 41*b*1, the flow rate regulator 42*b*1, and the joint 14*b*4 to the droplet dispersion mechanism 11*b*2 by opening the valve 41*b*1.

In Embodiment 1, a case where the processing liquid MC for use in resist removal is generated using sulfuric acid ($H_2SO_4$) as the chemical liquid C1 and aqueous hydrogen peroxide ($H_2O_2$) as the chemical liquid C2 is considered.

In this case, considered is a method of supplying the sulfuric acid ($H_2SO_4$) having been regulated by the temperature regulator 35*b*1 to have a temperature of approximately 90° C. and supplying the aqueous hydrogen peroxide ($H_2O_2$) directly from a container, such as a chemical supply tank and a canister, installed at the room temperature.

In Embodiment 1, the valve 21*b*1 is opened and the valve 21*b*2 is closed in the gas supply mechanism 20B to perform a temperature regulation process so that the gas G1 and the gas G2 each have a temperature of 130° C. or more, for example, through heating by the temperature regulator 25*b*1.

In this case, the temperature of the gas when the sulfuric acid ($H_2SO_4$) and the aqueous hydrogen peroxide ($H_2O_2$) are each dispersed into droplets can be set to be higher than the temperature of the sulfuric acid ($H_2SO_4$).

The temperature of the aqueous hydrogen peroxide ($H_2O_2$) as a material for the chemical liquid C2 is not increased in advance by circulating temperature regulation and the like to prevent the aqueous hydrogen peroxide from being rapidly decomposed by the increase in temperature in a case where the aqueous hydrogen peroxide ($H_2O_2$) contains many metallic impurities.

The sulfuric acid ($H_2SO_4$) as a material for the chemical liquid C1 is dispersed by the droplet dispersion mechanism 11*b*1 into droplets heated by the gas G1 to have a temperature higher than 90° C. On the other hand, the aqueous hydrogen peroxide ($H_2O_2$) as the material for the chemical liquid C2 is dispersed by the droplet dispersion mechanism 11*b*2 into droplets heated by the gas G2 to have a temperature higher than the room temperature.

In the droplet mixing mechanism 12*b*1, heat of reaction generated when the sulfuric acid ($H_2SO_4$) dispersed into droplets as the chemical liquid droplets GC1 and the aqueous hydrogen peroxide ($H_2O_2$) dispersed into droplets as the chemical liquid droplets GC2 are mixed is further added to the above-mentioned heated state.

As a result, the droplet mixing mechanism 12*b*1 can generate the processing liquid MC in the form of droplets having a higher temperature compared to a case where the sulfuric acid ($H_2SO_4$) having a temperature of 90° C. and the aqueous hydrogen peroxide ($H_2O_2$) having the room temperature are simply mixed.

In the processing liquid generation mechanism 10B in Embodiment 1, the chemical liquid droplets GC1 and the chemical liquid droplets GC2 having been dispersed into fine droplets are mixed in a state of being joining the flows of the gas G1 and the gas G2 to thereby be instantaneously and closely mixed together. The generated processing liquid MC in the form of droplets is fine and has a small thermal capacity, so that the temperature thereof increases rapidly due to accumulated heat of reaction.

Furthermore, the generated processing liquid MC in the form of droplets is joining the flow of the mixed gas, and is thus thermally insulated by the surrounding gas. Heat dissipation is moderate even if the gas has a lower temperature than the generated processing liquid MC in the form of droplets.

On the other hand, the droplet dispersion mechanism 11*z*1 illustrated in FIG. 7 disperses the mixed chemical liquid MC9 after all the heat of reaction is released into droplets using the gas G1, so that the mixed chemical liquid MC9 is exposed to a large amount of gas before joining the flow of the gas G1, and the temperature of the droplets is almost acclimatized to the temperature of the gas G1. It is thus necessary to set the temperature of the gas G1 to a high temperature required in the processing condition to secure high reactivity of the processing liquid MC.

In contrast, in the processing liquid generation mechanism 10B, the chemical liquid droplets GC1 and the chemical liquid droplets GC2 are instantaneously and closely mixed together, so that the length of piping required for mixing to reach discharge from the droplet mixing mechanism 12*b*1 through the discharge nozzle 13*b*1 can be made short, and reduction in temperature due to heat dissipation from the piping can be suppressed.

Furthermore, in the processing liquid generation mechanism 10B, the droplet dispersion mechanism 11*b*1, the droplet dispersion mechanism 11*b*2, the droplet mixing mechanism 12*b*1, and the discharge nozzle 13*b*1 are integrated with one another.

The first droplet generation process by the droplet dispersion mechanism 11*b*1, the second droplet generation process by the droplet dispersion mechanism 11*b*2, the droplet mixing process by the droplet mixing mechanism 12b1, and the discharge process by the discharge nozzle 13b1 can thus be performed within a relatively small processing region.

As a result, during operation of the processing liquid generation mechanism 10B in Embodiment 1, heat dissipation from the processing liquid generation mechanism 10B can be minimized.

As described above, there is concern that, when the chemical liquid C2 is the aqueous hydrogen peroxide ($H_2O_2$), the aqueous hydrogen peroxide is rapidly decomposed by the increase in temperature of the chemical liquid C2 by the gas G2 in a case where the aqueous hydrogen peroxide contains many metallic impurities. In Embodiment 1, however, the above-mentioned concern is almost negligible.

The reason is that, in the processing liquid generation mechanism 10B in Embodiment 1, a time period in which the temperature of the chemical liquid C2 and the chemical liquid droplets GC2 is increased is short enough to allow the droplet mixing mechanism 12b1 to perform the droplet mixing process of mixing the chemical liquid droplets GC1 and the chemical liquid droplets GC2 promptly after the droplet dispersion mechanism 11b2 acquires the chemical liquid droplets GC2.

According to the processing liquid generation method performed using the processing liquid generation mechanism 10B, the processing time can be reduced by securing high reactivity as in the processing liquid generation mechanism 10A. Furthermore, a semiconductor manufacturing apparatus utilizing the processing liquid generation mechanism 10B is expected to have an improved production capability.

In a case where the processing liquid MC for use in resist removal is generated, Condition 1 "TC1<TG1" and Condition 2 "TC2<TG2" are met where TC1 is the temperature of the chemical liquid C1 and TG1 is the temperature of the gas G1 during performance of the first droplet generation process by the droplet dispersion mechanism 11b1, TC2 is the temperature of the chemical liquid C2 and TG2 is the temperature of the gas G2 during performance of the second droplet generation process by the droplet dispersion mechanism 11b2.

As described above, the processing liquid generation mechanism 10B in Embodiment 1 is characterized by the temperature regulator 25b1 meeting both Condition 1 and Condition 2. That is to say, a gas temperature regulation condition imposed on the temperature regulation process performed by the temperature regulator 25b1 is both Condition 1 and Condition 2.

The processing liquid generation mechanism 10B has the above-mentioned features, so that the temperature of the chemical liquid droplets GC1 acquired through the first droplet generation process and the chemical liquid droplets GC2 acquired through the second droplet generation process can respectively be set to be higher than the temperature of the chemical liquid C1 and the chemical liquid C2 before generation of the droplets.

As a result, in the processing liquid generation mechanism 10B, the droplet mixing mechanism 12b1 can perform the above-mentioned droplet mixing process in a relatively high temperature state, so that reactivity of the processing liquid MC can further be improved.

The effect concerning reactivity of the processing liquid MC can be produced when at least one of Condition 1 and Condition 2 described above is met. That is to say, as for at least one of the droplet dispersion mechanism 11b1 and the droplet dispersion mechanism 11b2 before which the temperature regulator is located, the gas temperature regulation condition is Condition "TC<TG" where TC is the temperature of at least one chemical liquid to be processed by the at least one droplet dispersion mechanism, TG is the temperature of at least one gas corresponding to the at least one chemical liquid.

(Semiconductor Manufacturing Apparatus)

Figure 2:
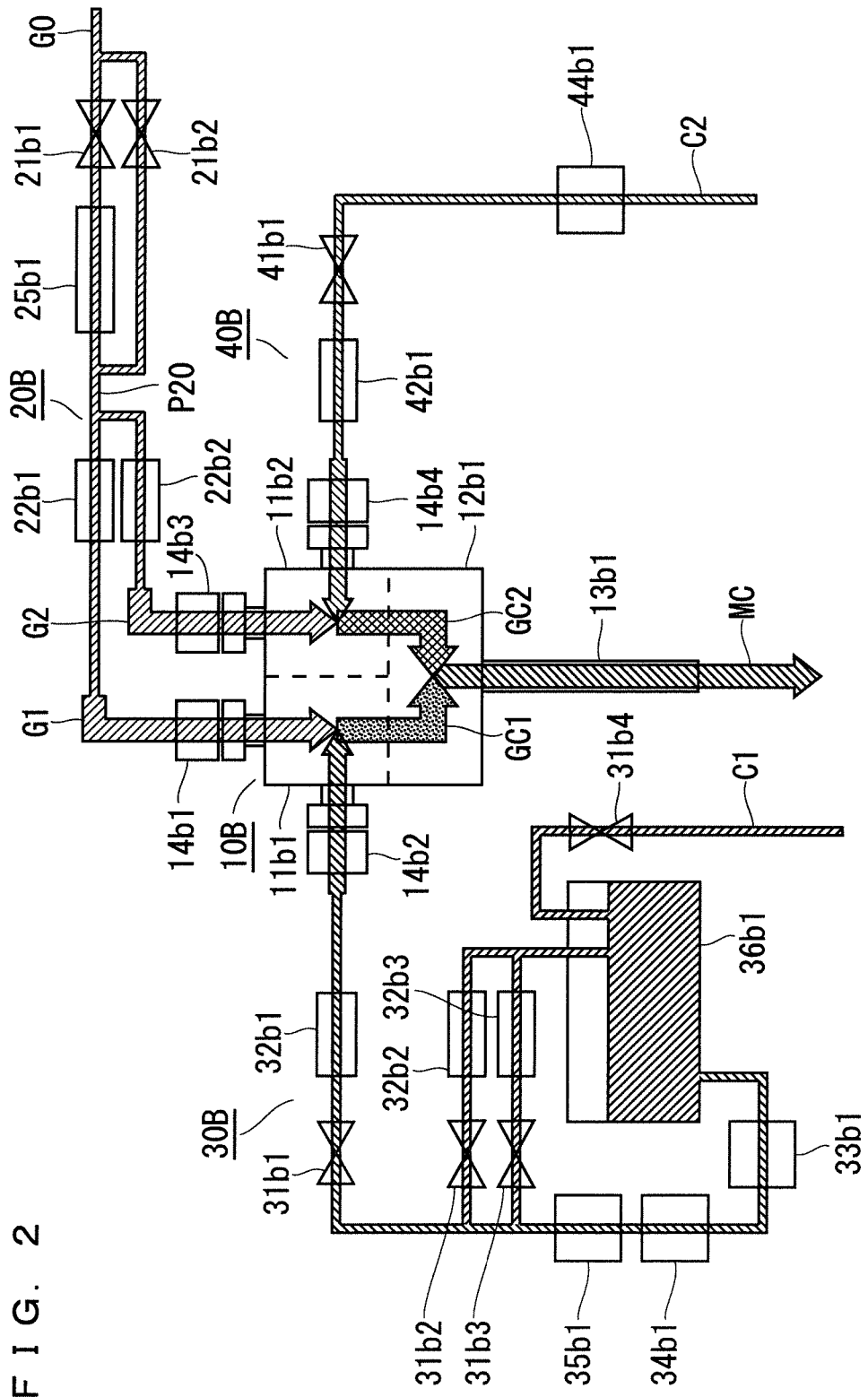
FIG. 2 illustrates an internal configuration of a processing liquid generation mechanism in Embodiment 1.
Figure 3:
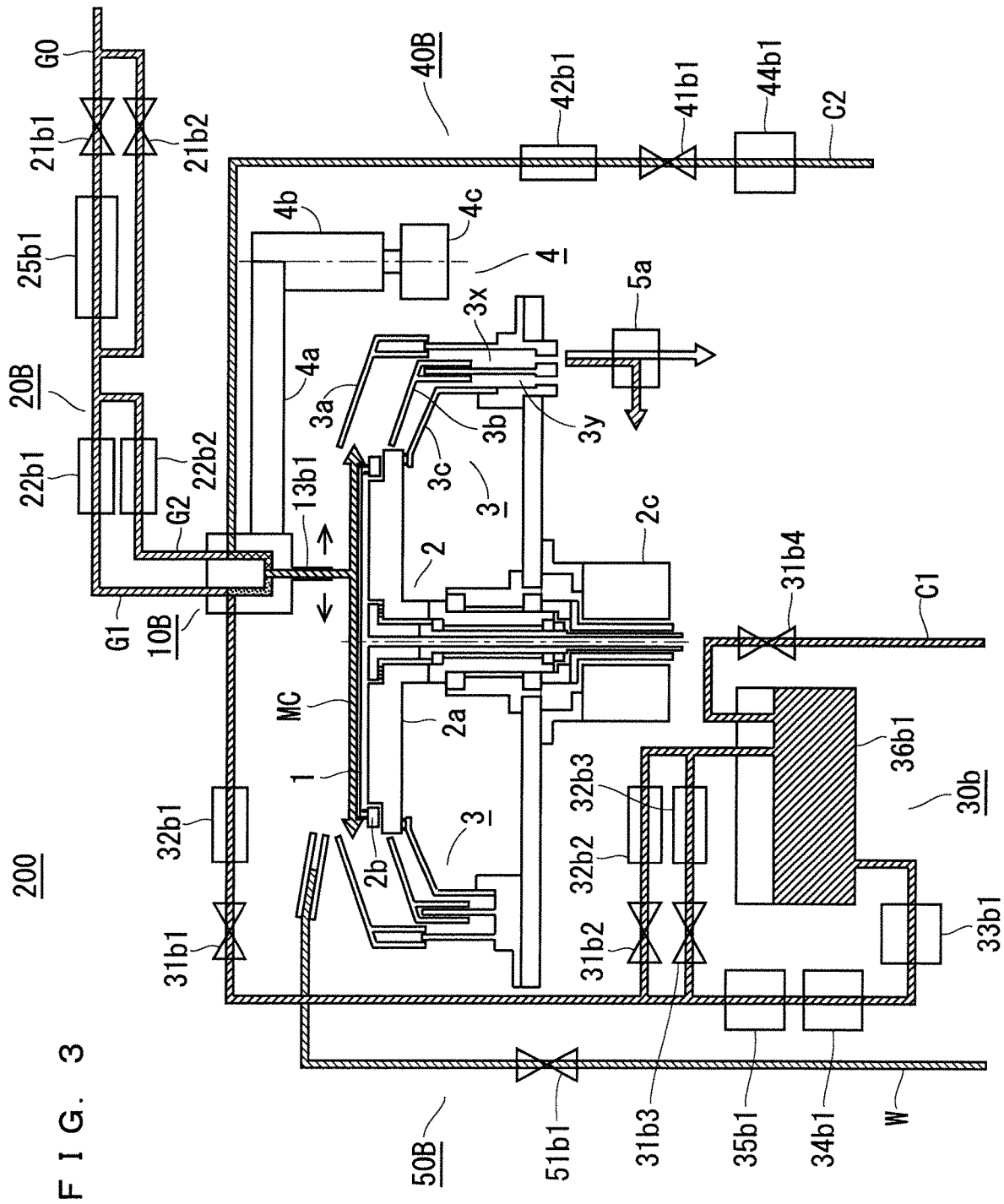
FIG. 3 illustrates an internal configuration of a semiconductor manufacturing apparatus in Embodiment 1.

FIG. 3 illustrates an internal configuration of a processing mechanism 200 as a main part of a semiconductor manufacturing apparatus in Embodiment 1. The processing mechanism 200 includes main components including the processing liquid generation mechanism 10B in Embodiment 1 and the peripherals thereof, and a wafer chuck stage mechanism 2, a cup mechanism 3, a nozzle scan mechanism 4, an air-water separator 5a, and a water supply mechanism 50B. Hereinafter, components equivalent to those in FIG. 2 bear the same reference signs, description thereof is omitted as appropriate, and features unique to the processing mechanism 200 will mainly be described.

The wafer chuck stage mechanism 2 holds a semiconductor wafer 1 as mounted on a wafer stage 2a. After the semiconductor wafer 1 is mounted on the wafer stage 2a, the semiconductor wafer 1 is held by a wafer chuck 2b. The wafer stage 2a can rotationally be moved by a stage rotary motor 2c.

The nozzle scan mechanism 4 includes a scan arm 4a, a scan shaft 4b, and a scan motor 4c as main components.

The scan shaft 4b is rotated by rotational operation of the scan motor 4c. By moving the scan shaft 4b up and down, the processing liquid generation mechanism 10B fixed to the scan arm 4a is moved above the semiconductor wafer 1 so that the discharge nozzle 13b1 to discharge the processing liquid MC is located at a level taught from an upper surface of the semiconductor wafer 1.

The cup mechanism 3 includes a chemical liquid cup 3a, a washing cup 3b, and a guard 3c as main components. In the cup mechanism 3, a path 3x between the chemical liquid cup 3a and the washing cup 3b is a path to eject the processing liquid MC, and a path 3y between the washing cup 3b and the guard 3c is a path to eject water W.

The water supply mechanism 50B includes a valve 51b1. When the semiconductor wafer 1 is washed, the valve 51b1 is opened to supply the water W to the semiconductor wafer 1.

Figure 4:
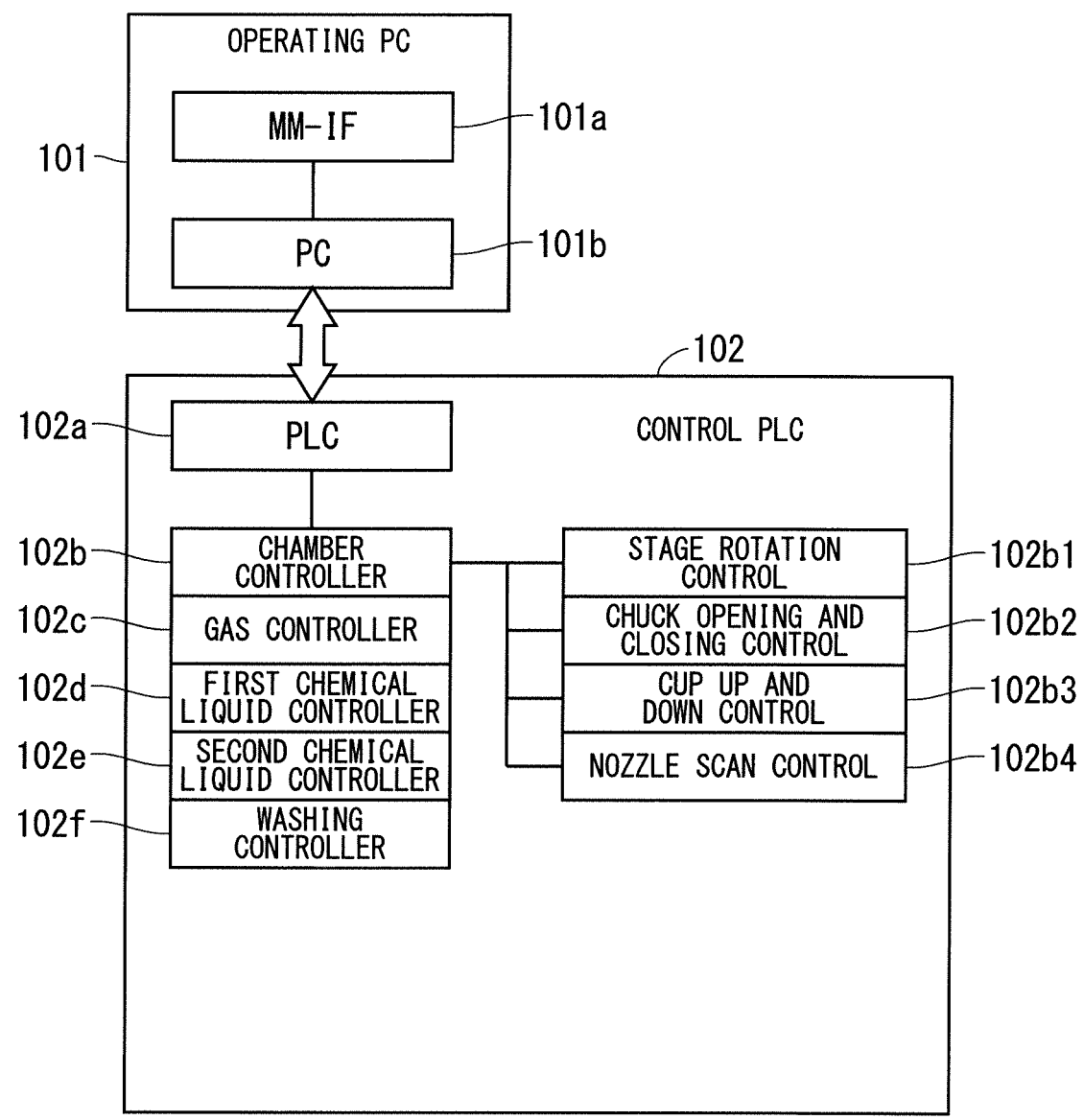
FIG. 4 is a block diagram showing a configuration of a control system of the semiconductor manufacturing apparatus illustrated in FIG. 3.

FIG. 4 is a block diagram showing a part of a configuration of a control system of the processing mechanism 200 illustrated in FIG. 3.

As shown in FIG. 4, the control system of the processing mechanism 200 includes an operating PC 101 and a control programmable logic controller (PLC) 102.

The operating PC 101 provides control instructions to the control PLC 102, and the control PLC 102 controls the processing mechanism 200 in accordance with the control instructions from the operating PC 101.

The operating PC 101 includes a man-machine interface (MM-IF) 101a and a PC 101b as main components.

The control PLC 102 includes a PLC 102a, and a chamber controller 102b, a gas controller 102c, a first chemical liquid controller 102d, a second chemical liquid controller 102e, and a washing controller 102f controlled by the PLC 102a as main components.

Control performed by the chamber controller 102b includes stage rotation control 102b1, chuck opening and closing control 102b2, cup up and down control 102b3, and nozzle scan control 102b4.

As components not shown in FIGS. 3 and 4, a carrier to store the semiconductor wafer 1, a load port as a main component of a carrying mechanism of the semiconductor manufacturing apparatus, a robot to carry the semiconductor wafer 1 between the load port and the processing mechanism 200, and the like are included, but these components are not shown for purposes of explanation.

Figure 5:
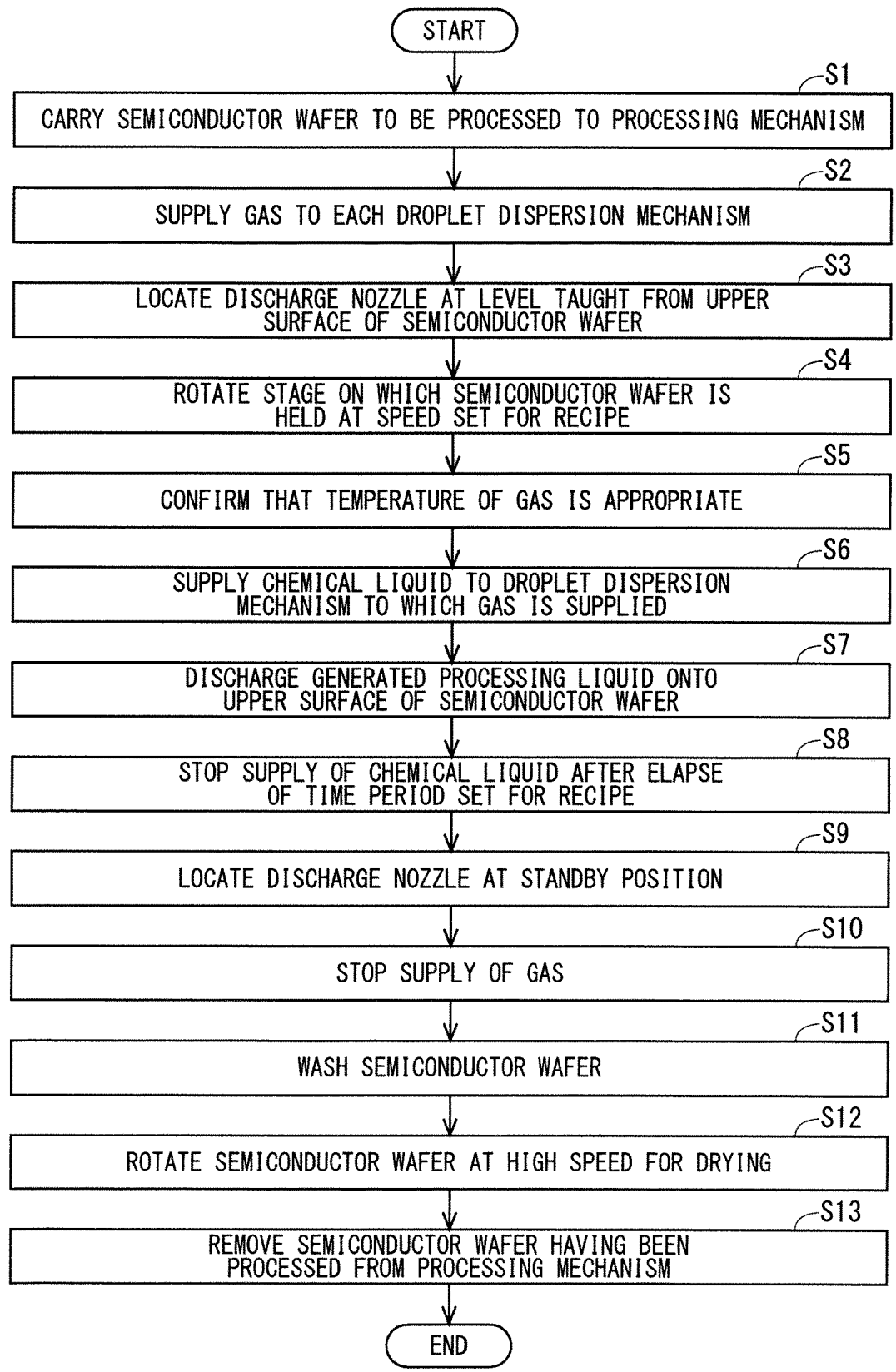
FIG. 5 is a flowchart showing operations of a semiconductor manufacturing method performed using the semiconductor manufacturing apparatus illustrated in FIG. 3.

FIG. 5 is a flowchart showing a flow of operations of a semiconductor manufacturing method performed using the processing mechanism 200 in Embodiment 1 illustrated in FIG. 3. Operations in S1 to S13 shown in FIG. 5 are sequentially performed under control of the control system shown in FIG. 4.

The semiconductor manufacturing method performed using the processing mechanism 200 in Embodiment 1 will be described below with reference to FIG. 5.

Processes to reach the operation in S1 will be described first.

The carrier, which is not illustrated, storing the semiconductor wafer 1 is installed in the load port, which is not illustrated, and the PC 101b is operated through the MM-IF 101a to transmit a command to the PLC 102a to start a mapping process. The mapping process is a process of recognizing a slot position of the semiconductor wafer 1 stored in the carrier. The load port is a carrier holding mechanism including a stage to which an operator sets the carrier and a mapping mechanism as main components, and allowing a carrying robot, which is not illustrated, to transfer the semiconductor wafer 1 in and out of the carrier.

After the end of the mapping process, the operator grasps, on the MM-IF 101a, the slot position of the semiconductor wafer 1 stored in the carrier, selects a recipe set in advance collectively or for each slot by operating the PC 101b through the MM-IF 101a, and transmits a command to the PLC 102a to start processes based on the recipe. The processes for the semiconductor wafer 1 are sequentially performed while a parameter, a monitor value, and the like set for the recipe are communicated between the PC 101b and the PLC 102a.

The operator performs the above-mentioned operation to reach the operation in S1. The operation in S1 indicates an operation of carrying the semiconductor wafer to be processed to the processing mechanism.

On a side of the processing mechanism 200, the chemical liquid cup 3a and the washing cup 3b are located at a lower level as an original point, and the wafer chuck 2b is opened through the chuck opening and closing control 102b2 to be in a waiting state so that the semiconductor wafer 1 can be mounted.

In this waiting state, the semiconductor wafer 1 is removed from a selected slot one at a time by the carrying robot, which is not illustrated, and mounted on the wafer stage 2a on the side of the processing mechanism 200.

After the semiconductor wafer 1 is mounted properly on the wafer stage 2a, the wafer chuck 2b is closed through the chuck opening and closing control 102b2 to hold the semiconductor wafer 1.

As described above, the semiconductor wafer 1 as a target of manufacture is carried to the processing mechanism 200 by performing the operation in S1.

Next, in the operation in S2, the gas G0 is supplied to the gas supply mechanism 20B to thereby supply the gas G1 to the droplet dispersion mechanism 11b1 and the gas G2 to the droplet dispersion mechanism 11b2 of the processing liquid generation mechanism 10B. In this case, the gas G0 is supplied while one of the valve 21b1 and the valve 21b2 is opened and the other one of the valve 21b1 and the valve 21b2 is closed, and the gas G0 passes through the flow rate regulator 22b1 and the flow rate regulator 22b2, so that the temperature and the flow rate of each of the gas G1 and the gas G2 are set.

The operation in S2 is performed under control of the gas controller 102c. In a case where the temperature of the gas G0 is regulated, the gas controller 102c sets a set temperature of the temperature regulator 25b1 to a temperature set for the recipe, and opens the valve 21b1 and closes the valve 21b2.

In a case where the temperature of the gas G0 is not regulated, the gas controller 102c opens the valve 21b2 and closes the valve 21b1.

Regardless of whether to regulate the temperature of the gas G0, the gas controller 102c sets a flow rate regulated by the flow rate regulator 22b1 and a flow rate regulated by the flow rate regulator 22b2 to flow rates set for the recipe.

As described above, the gas G1 is supplied to the droplet dispersion mechanism 11b1, and the gas G2 is supplied to the droplet dispersion mechanism 11b2 by performing the operation in S2.

The operation in S2 is performed prior to a chemical liquid supply process shown in the operation in S6 considering a time to stabilize regulation of the temperature of the gas G0.

Next, in the operation in S3, the nozzle scan mechanism 4 moves the processing liquid generation mechanism 10B so that the discharge nozzle 13b1 is located at the level taught from the upper surface of the semiconductor wafer 1.

The operation in S3 is performed under control of the chamber controller 102b. The chemical liquid cup 3a is moved up through the cup up and down control 102b3.

At the same time, up and down movement of the scan shaft 4b and the rotational operation of the scan motor 4c are controlled through nozzle scan control 102b4 to move the processing liquid generation mechanism 10B fixed to the scan arm 4a above the semiconductor wafer 1 so that the discharge nozzle 13b1 to discharge the processing liquid MC is located at the level taught from the upper surface of the semiconductor wafer 1.

As described above, the discharge nozzle is located at the level taught from the upper surface of the semiconductor wafer by performing the operation in S3.

Then, in the operation in S4, the wafer chuck stage mechanism 2 rotates the wafer stage 2a on which the semiconductor wafer 1 is held at a set speed as a speed set for the recipe.

The operation in S4 is performed under control of the chamber controller 102b. Specifically, rotation of the stage rotary motor 2c is controlled through the stage rotation control 102b1 to rotate the wafer stage 2a on which the semiconductor wafer 1 is held at the set speed suitable for a chemical liquid process set for the recipe.

Then, the operation in S5 is performed to confirm that the temperature of the gas G0 for the gas G1 and the gas G2 regulated by the temperature regulator 25b1 is appropriate. Transition to the next operation in S6 is not made until the temperature of the gas G0 falls within an appropriate temperature range.

The operation in S5 is performed under control of the gas controller 102c. The operation in S5 becomes necessary in a case where the temperature regulator 25b1 regulates the temperature of the gas G1 and the gas G2. The gas controller 102c can confirm that the temperature of the gas G0 falls within the appropriate temperature range set for the recipe from a value of a temperature sensor incorporated in the temperature regulator 25b1.

As described above, the operation in S5 is performed prior to the chemical liquid supply process in the operation in S6 as with the operation in S2 to confirm that the temperature of the gas G0 is appropriate.

In the operation in S6, the chemical liquid C1 is supplied from the circulating temperature regulation supply mechanism 30B to the droplet dispersion mechanism 11$b$1, and the chemical liquid C2 is supplied from the chemical liquid supply mechanism 40B to the droplet dispersion mechanism 11$b$2. The chemical liquid C1 has been regulated to have an appropriate temperature by the temperature regulator 35$b$1.

The operation in S6 is performed under control of the first chemical liquid controller 102$d$ and the second chemical liquid controller 102$e$. The first chemical liquid controller 102$d$ opens the valve 31$b$1 and closes the valve 31$b$2, and sets a flow rate regulated by the flow rate regulator 32$b$1 to a flow rate for the chemical liquid C1 set for the recipe, so that the chemical liquid C1 is supplied to the droplet dispersion mechanism 11$b$1 to which the gas G1 is supplied.

At the same time, the second chemical liquid controller 102$e$ opens the valve 41$b$1, and sets a flow rate regulated by the flow rate regulator 42$b$1 to a flow rate for the chemical liquid C2 set for the recipe, so that the chemical liquid C2 is supplied to the droplet dispersion mechanism 11$b$2 to which the gas G2 is supplied.

As a result, the processing liquid generation mechanism 10B performs the first droplet generation process, the second droplet generation process, and the droplet mixing process.

That is to say, the droplet dispersion mechanism 11$b$1 performs the first droplet generation process of supplying the gas G1 to the chemical liquid C1, and dispersing the chemical liquid C1 into droplets to acquire the chemical liquid droplets GC1, and the droplet dispersion mechanism 11$b$2 performs the second droplet generation process of supplying the gas G2 to the chemical liquid C2, and dispersing the chemical liquid C2 into droplets to acquire the chemical liquid droplets GC2.

The droplet mixing process of mixing the chemical liquid droplets GC1 and the chemical liquid droplets GC2 is further performed by the droplet mixing mechanism 12$b$1 to be continuous with the first droplet generation process and the second droplet generation process to acquire the processing liquid MC in the form of droplets.

In the operation in S7 performed parallel to the operation in S6, the discharge process of discharging the processing liquid MC generated in the first droplet generation process, the second droplet generation process, and the droplet mixing process performed by the processing liquid generation mechanism 10B onto the upper surface of the semiconductor wafer 1 through the discharge nozzle 13$b$1 is performed.

The operation in S7 is performed under control of the chamber controller 102$b$. In a time period during which the operation in S7 is performed, the discharge nozzle 13$b$1 may be located approximately above the center of the semiconductor wafer 1 through the nozzle scan control 102$b$4.

In addition, rotation of the scan motor 4$c$ may be controlled to cause the discharge nozzle 13$b$1 to scan above the surface of the semiconductor wafer 1. In this case, the processing liquid MC can uniformly and directly be supplied to the upper surface of the semiconductor wafer 1 as a whole, so that reactivity of the processing liquid MC in the form of droplets can more uniformly be effected.

The processing liquid MC used in the process is ejected through the path 3$x$ to the air-water separator 5$a$.

As described above, the chemical liquid C1 and the chemical liquid C2 are supplied to the processing liquid generation mechanism 10B, the droplet mixing process is performed to be continuous with the first droplet generation process and the second droplet generation process, and the processing liquid MC is uniformly discharged onto the upper surface of the semiconductor wafer 1 through the discharge nozzle 13$b$1 by performing the operations in S6 and S7.

In the operation in S8 following the operation in S7, supply of the chemical liquid C1 and the chemical liquid C2 is stopped after the elapse of a time period set for the recipe since the start of supply of the chemical liquid C1 and the chemical liquid C2 to end the process.

That is to say, processes in the operations in S6 and S7 are performed continuously until the above-mentioned time period set for the recipe has elapsed since the start of performance, and then automatically end in the operation in S8.

The operation in S8 is performed under control of the first chemical liquid controller 102$d$ and the second chemical liquid controller 102$e$. After the elapse of the above-mentioned time period set for the recipe, the first chemical liquid controller 102$d$ closes the valve 31$b$1 and opens the valve 31$b$2, and the second chemical liquid controller 102$e$ closes the valve 41$b$1 to end the processes in the operations in S6 and S7.

Then, in the operation in S9, the discharge nozzle 13$b$1 is moved to a standby position away from the semiconductor wafer 1 to be located at the standby position.

The operation in S9 is performed under control of the chamber controller 102$b$. Specifically, the washing cup 3$b$ is moved up through the cup up and down control 102$b$3, and the up and down movement of the scan shaft 4$b$ and the rotation of the scan motor 4$c$ are controlled through the nozzle scan control 102$b$4 to move the processing liquid generation mechanism 10B fixed to the scan arm 4$a$ to the standby position to locate the processing liquid generation mechanism 10B at the standby position.

Then, in the operation in S10, supply of the gas G0 to the gas supply mechanism 20B is stopped so that the gas G1 and the gas G2 are not supplied to the processing liquid generation mechanism 10B.

The operation in S10 is performed under control of the gas controller 102$c$. That is to say, the gas controller 102$c$ closes the valve 21$b$1 or the valve 21$b$2 being opened, and sets the flow rates regulated by the flow rate regulator 22$b$1 and the flow rate regulator 22$b$2 to zero to stop supply of the gas G1 and the gas G2.

In the operation in S11, the semiconductor wafer 1 is washed.

The operation in S11 is performed under control of the chamber controller 102$b$ and the washing controller 102$f$. The rotation of the stage rotary motor 2$c$ is controlled through the stage rotation control 102$b$1 to rotate the wafer stage 2$a$ on which the semiconductor wafer 1 is held at a speed suitable for a washing process set for the recipe. At the same time, the washing controller 102$f$ opens the valve 51$b$1 to supply the water W to the semiconductor wafer 1 to thereby wash the semiconductor wafer 1.

The water W used for cleaning of the semiconductor wafer 1 is ejected through the path 3$y$ to the air-water separator 5$a$.

After the elapse of the time period set for the recipe, in the operation in S12, the wafer chuck stage mechanism 2 rotates the semiconductor wafer 1 at a high speed to dry the semiconductor wafer 1.

The operation in S12 is performed under control of the chamber controller 102$b$ and the washing controller 102$f$. The washing controller 102$f$ closes the valve 51$b$1, and the rotation of the stage rotary motor 2*c* is controlled through the stage rotation control 102*b*1 to rotate the wafer stage 2*a* on which the semiconductor wafer 1 is held at a high speed suitable for a drying process set for the recipe. As a result, the semiconductor wafer 1 can be dried.

After the elapse of the time period set for the recipe, the rotation of the stage rotary motor 2*c* is stopped through the stage rotation control 102*b*1 to end the drying process, the chemical liquid cup 3*a* and the washing cup 3*b* are moved down to the original point through the cup up and down control 102*b*3, and the wafer chuck 2*b* is opened through the chuck opening and closing control 102*b*2 to be in the waiting state.

By the end of the operation in S12, a series of processes performed on the upper surface of the semiconductor wafer 1 is completed so that the semiconductor wafer 1 as completed is acquired.

Finally, in the operation in S13, the semiconductor wafer 1 having been processed is removed from the position on the wafer stage 2*a*. The semiconductor wafer 1 is removed by the carrying robot, which is not illustrated.

The semiconductor wafer 1 having been processed is returned to the original slot, or stored in another carrier.

After the end of the operation in S13, the processing mechanism 200 can perform the operations in S1 to S13 again with respect to the semiconductor wafer 1 as a new target of manufacture.

As described above, the semiconductor manufacturing method is performed using the semiconductor manufacturing apparatus having the processing mechanism 200 utilizing the processing liquid generation mechanism 10B, so that the processing liquid MC having been closely mixed in the form of droplets to have high reactivity can uniformly be discharged onto the upper surface of the semiconductor wafer 1 as the target of manufacture. In a case where the processing liquid MC is for use in resist removal, for example, the processing liquid MC having a high resist removal capability and high reactivity is discharged onto the upper surface of the semiconductor wafer 1, so that a processing time for removal of a resist formed on the semiconductor wafer 1 can be reduced.

As a result, in a case where the semiconductor manufacturing method performed using the processing mechanism 200 includes a resist removal operation, a production capability to produce the semiconductor wafer 1 as completed is expected to be improved.

Embodiment 2

(Basic Configuration)

Figure 6:
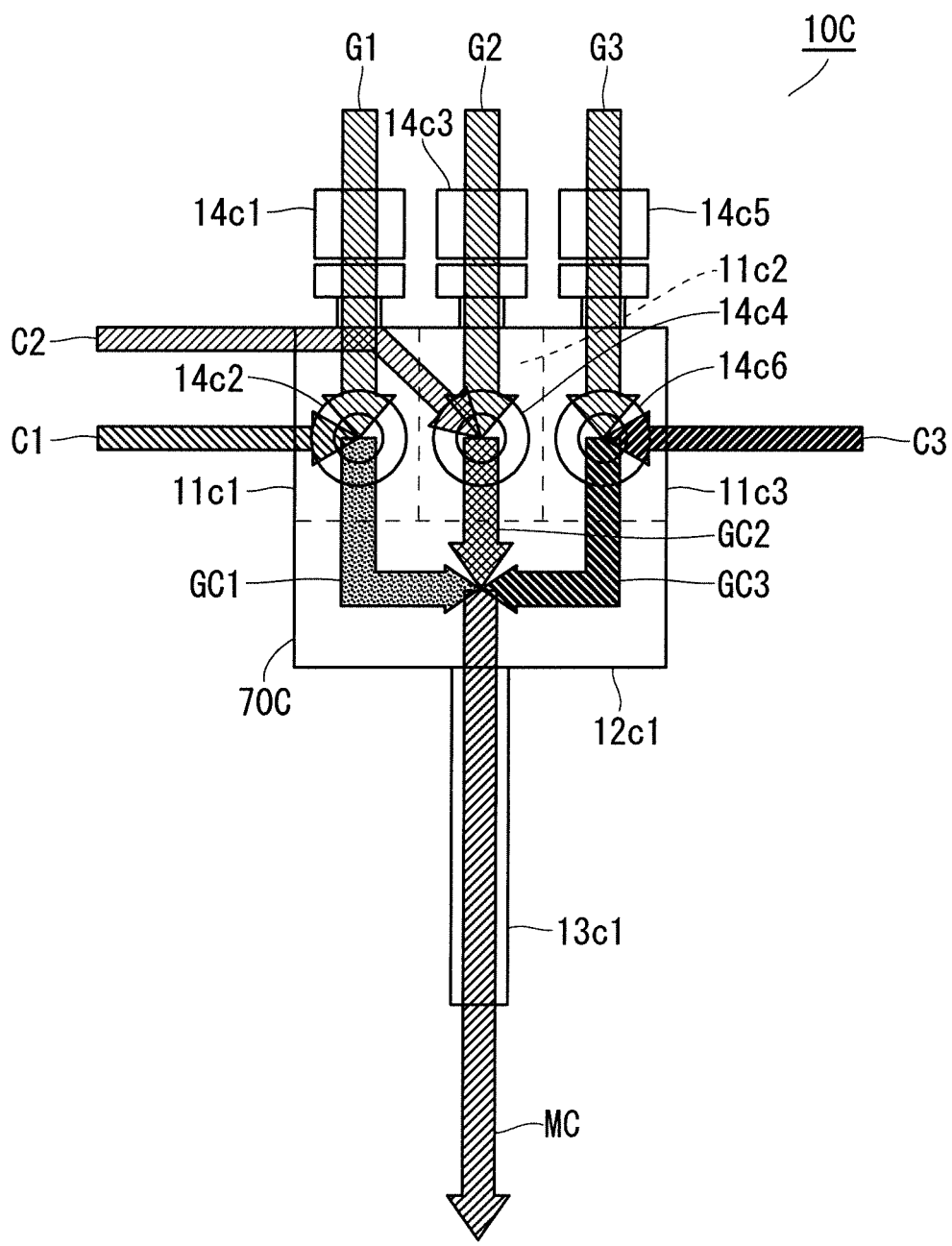
FIG. 6 illustrates an internal configuration of a processing liquid generation mechanism in Embodiment 2.

FIG. 6 illustrates an internal configuration of the processing liquid generation mechanism 10C in Embodiment 2. The processing liquid generation mechanism 10C handles three chemical liquids: the chemical liquid C1, the chemical liquid C2, and a chemical liquid C3.

The processing liquid generation mechanism 10C includes a droplet dispersion mechanism 11*c*1, a droplet dispersion mechanism 11*c*2, and a droplet dispersion mechanism 11*c*3, a droplet mixing mechanism 12*c*1, a discharge nozzle 13*c*1, and joints 14*c*1 to 14*c*6 as main components, and has an integrated structure.

The droplet dispersion mechanism 11*c*1 as the first droplet dispersion mechanism performs the first droplet generation process of supplying the gas G1 as the first gas to the chemical liquid C1 as the first chemical liquid, and dispersing the chemical liquid C1 into droplets to acquire the chemical liquid droplets GC1 as the first chemical liquid droplets.

The gas G1 is supplied to an interior of the droplet dispersion mechanism 11*c*1 through the joint 14*c*1, the chemical liquid C1 is supplied to the interior of the droplet dispersion mechanism 11*c*1 through the joint 14*c*2, and the chemical liquid droplets GC1 are supplied to the droplet mixing mechanism 12*c*1 within the above-mentioned structure.

The droplet dispersion mechanism 11*c*2 as the second droplet dispersion mechanism performs the second droplet generation process of supplying the gas G2 as the second gas to the chemical liquid C2 as the second chemical liquid, and dispersing the chemical liquid C2 into droplets to acquire the chemical liquid droplets GC2 as the second chemical liquid droplets.

The gas G2 is supplied to an interior of the droplet dispersion mechanism 11*c*2 through the joint 14*c*3, the chemical liquid C2 is supplied to the interior of the droplet dispersion mechanism 11*c*2 through the joint 14*c*4, and the chemical liquid droplets GC2 are supplied to the droplet mixing mechanism 12*c*1 within the above-mentioned structure.

The droplet dispersion mechanism 11*c*3 as a third droplet dispersion mechanism performs a third droplet generation process of supplying gas G3 as third gas to the chemical liquid C3 as a third chemical liquid, and dispersing the chemical liquid C3 into droplets to acquire chemical liquid droplets GC3 as third chemical liquid droplets.

The gas G3 is supplied to an interior of the droplet dispersion mechanism 11*c*3 through the joint 14*c*5, the chemical liquid C3 is supplied to the interior of the droplet dispersion mechanism 11*c*3 through the joint 14*c*6, and the chemical liquid droplets GC3 are supplied to the droplet mixing mechanism 12*c*1 within the above-mentioned structure.

The droplet mixing mechanism 12*c*1 performs the droplet mixing process of mixing the chemical liquid droplets GC1, the chemical liquid droplets GC2, and the chemical liquid droplets GC3 to acquire the processing liquid MC in the form of droplets.

The discharge nozzle 13*c*1 performs the discharge process of externally discharging the processing liquid MC received from the droplet mixing mechanism 12*c*1.

In the processing liquid generation method performed using the above-mentioned processing liquid generation mechanism 10C, the droplet mixing process is performed to be continuous with the first droplet generation process, the second droplet generation process, and the third droplet generation process to thereby generate the processing liquid MC in the form of droplets.

As described above, in the processing liquid generation mechanism 10C in Embodiment 2, the chemical liquid droplets GC1, the chemical liquid droplets GC2, and the chemical liquid droplets GC3 acquired respectively by the droplet dispersion mechanism 11*c*1, the droplet dispersion mechanism 11*c*2, and the droplet dispersion mechanism 11*c*3 have been dispersed into fine droplets, and are joining the flows of the gas G1, the gas G2, and the gas G3. The chemical liquid droplets GC1, the chemical liquid droplets GC2, and the chemical liquid droplets GC3 are thus instantaneously and closely mixed together in a relatively short time during performance of the droplet mixing process by the droplet mixing mechanism 12*c*1. The temperature of the droplets having a small thermal capacity increases rapidly due to heat of reaction. That is to say, the length of piping from the droplet mixing mechanism 12c1 to the discharge nozzle 13c1 can be made relatively short, and thus reduction in reactivity due to heat dissipation from the piping can be suppressed. On the other hand, the generated processing liquid MC in the form of droplets is joining a flow of a mixed gas, and is thus thermally insulated by the surrounding gas. Heat dissipation is moderate even if the gas has a lower temperature than the processing liquid MC in the form of droplets. The processing liquid MC in the form of droplets in an appropriate condition in which high reactivity is secured by maintaining a high temperature is made available by the processing liquid generation method performed using the processing liquid generation mechanism 10C.

According to the processing liquid generation method performed using the processing liquid generation mechanism 10C in Embodiment 2, a processing liquid generation method for suppressing reduction in reactivity and setting the temperature of the gas G1, the gas G2, and the gas G3 used for dispersion into droplets to a temperature lower than the temperature required in the processing condition can be achieved to secure high reactivity of the processing liquid MC to thereby reduce the processing time. The semiconductor manufacturing apparatus and the semiconductor manufacturing method utilizing the processing liquid generation mechanism 10C are expected to have a high production capability.

In Embodiment 2, in a case where the processing liquid MC for use in resist removal is generated, Condition 1 "TC1<TG1", Condition 2 "TC2<TG2", and Condition 3 "TC3<TG3" are met where TC1 is the temperature of the chemical liquid C1 and TG1 is the temperature of the gas G1 during performance of the first droplet generation process by the droplet dispersion mechanism 11c1, TC2 is the temperature of the chemical liquid C2 and TG2 is the temperature of the gas G2 during performance of the second droplet generation process by the droplet dispersion mechanism 11c2, TC3 is the temperature of the chemical liquid C3 and TG3 is the temperature of the gas G3 during performance of the third droplet generation process by the droplet dispersion mechanism 11c3.

As described above, the processing liquid generation mechanism 10C in Embodiment 2 is further characterized in that Condition 1, Condition 2, and Condition 3 are all met. It is thus desirable to provide a temperature regulator corresponding to the temperature regulator 25b1 of the gas supply mechanism 20B in Embodiment 1 on a path to supply the gas G1, the gas G2, and the gas G3 in the processing liquid generation mechanism 10C. In this case, the gas temperature regulation condition imposed on the temperature regulation process performed by the temperature regulator is all Condition 1, Condition 2 and Condition 3.

The processing liquid generation mechanism 10C has the above-mentioned features, so that the temperature of the chemical liquid droplets GC1 acquired through the first droplet generation process, the chemical liquid droplets GC2 acquired through the second droplet generation process, and the chemical liquid droplets GC3 acquired through the third droplet generation process can respectively be set to be higher than the temperature of the chemical liquid C1, the chemical liquid C2, and the chemical liquid C3 before generation of the droplets.

As a result, in the processing liquid generation mechanism 10C, the droplet mixing mechanism 12c1 can perform the above-mentioned droplet mixing process in a relatively high temperature state, so that reactivity of the processing liquid MC can further be improved.

The effect concerning reactivity of the processing liquid MC can be produced when at least one of Condition 1, Condition 2, and Condition 3 described above is met. That is to say, as for at least one of the droplet dispersion mechanism 11c1, the droplet dispersion mechanism 11c2, and the droplet dispersion mechanism 11c3 before which the temperature regulator is located, the gas temperature regulation condition is Condition "TC<TG" where TC is the temperature of at least one chemical liquid to be processed by the at least one droplet dispersion mechanism, TG is the temperature of at least one gas corresponding to the at least one chemical liquid.

Examples of a combination of the chemical liquid C1, the chemical liquid C2, and the chemical liquid C3 include a combination of sulfuric acid ($H_2SO_4$) as the chemical liquid C1, aqueous hydrogen peroxide ($H_2O_2$) as the chemical liquid C2, and hydrofluoric acid (HF) as the chemical liquid C3 to perform a process of removing organic matter and an oxide film on the surface of the semiconductor wafer to form a new chemical oxide film, a combination of sulfuric acid ($H_2SO_4$) as the chemical liquid C1, nitric acid ($HNO_3$) as the chemical liquid C2, and hydrofluoric acid (HF) as the chemical liquid C3 to perform a process of etching Si as the semiconductor wafer at a high speed, and the like.

In any of these cases, the semiconductor manufacturing apparatus and the semiconductor manufacturing method to secure high reactivity of the processing liquid generated in a similar manner, reduce the processing time, and be expected to have an improved production capability can be acquired by utilizing heat of reaction generated through mixture.

Others

While the droplets described in the above-mentioned embodiments are each expected to have a particle size of approximately one to several hundred micrometers, the particle size is dependent on a gas flow rate, a gas flow speed, the length of piping, viscosity, surface tension, and the like, and the viscosity and the surface tension vary greatly with a mixing ratio and the temperature of chemical liquids.

In the above-mentioned processing liquid generation mechanism 10B in Embodiment 1, two chemical liquids, that is, the chemical liquid C1 and the chemical liquid C2, are mixed to generate the processing liquid MC. In the above-mentioned processing liquid generation mechanism 10C in Embodiment 2, three chemical liquids, that is, the chemical liquid C1, the chemical liquid C2, and the chemical liquid C3, are mixed to generate the processing liquid MC.

The number of combined chemical liquids is not limited to two and three as described above, and there are various combinations of chemical liquids that can utilize heat of reaction through mixture immediately before the process and various combinations of chemical liquids that can increase concentration of active species. For example, four or more chemical liquids may be combined.

That is to say, the processing liquid generation mechanism 10B in Embodiment 1 and the processing liquid generation mechanism 10C in Embodiment 2 may be expanded to conceive various aspects for mixing a plurality of chemical liquids after dispersing the chemical liquids into droplets. In the above-mentioned various aspects, a plurality of chemical liquids in the form of droplets are instantaneously and closely mixed together to accumulate heat of reaction at once or generate active species, so that the processing liquid MC meeting an appropriate condition in which high reactivity is secured can be generated.

Embodiments of the present invention can freely be combined with each other, and can be modified or omitted as appropriate within the scope of the invention. For example, in the processing mechanism 200 in Embodiment 1, the processing liquid generation mechanism 10C in Embodiment 2 may be used in place of the processing liquid generation mechanism 10B in Embodiment 1 by increasing the number of chemical liquids to three.

While the invention has been shown and described in detail, the foregoing description is in all aspects illustrative and not restrictive. It is therefore understood that numerous modifications and variations can be devised without departing from the scope of the invention.

What is claimed is:

1. A processing liquid generation method comprising:
   a first droplet generation process of generating droplets of a first chemical liquid to acquire first chemical liquid droplets;
   a second droplet generation process of generating droplets of a second chemical liquid to acquire second chemical liquid droplets; and
   a droplet mixing process of mixing at least the first chemical liquid droplets and the second chemical liquid droplets to acquire a processing liquid in a form of droplets.

2. The processing liquid generation method according to claim 1, further comprising
   a third droplet generation process of generating droplets of a third chemical liquid to acquire third chemical liquid droplets, wherein
   the droplet mixing process includes a process of mixing at least the first chemical liquid droplets, the second chemical liquid droplets, and the third chemical liquid droplets to acquire the processing liquid in the form of droplets.

3. The processing liquid generation method according to claim 1, wherein
   the first droplet generation process is performed by supplying first gas to the first chemical liquid,
   the second droplet generation process is performed by supplying second gas to the second chemical liquid, and
   at least one of Condition 1 "TC1<TG1" and Condition 2 "TC2<TG2" is met where TC1 is temperature of the first chemical liquid and TG1 is temperature of the first gas during performance of the first droplet generation process, TC2 is temperature of the second chemical liquid and TG2 is temperature of the second gas during performance of the second droplet generation process.

4. A processing liquid generation mechanism comprising:
   a first droplet dispersion mechanism to perform a first droplet generation process of supplying first gas to a first chemical liquid, and dispersing the first chemical liquid into droplets to acquire first chemical liquid droplets;
   a second droplet dispersion mechanism to perform a second droplet generation process of supplying second gas to a second chemical liquid, and dispersing the second chemical liquid into droplets to acquire second chemical liquid droplets;
   a droplet mixing mechanism to perform a droplet mixing process of mixing at least the first chemical liquid droplets and the second chemical liquid droplets to acquire a processing liquid in a form of droplets; and
   a discharge nozzle to perform a discharge process of externally discharging the processing liquid received from the droplet mixing mechanism.

5. The processing liquid generation mechanism according to claim 4, wherein
   at least the first droplet dispersion mechanism, the second droplet dispersion mechanism, the droplet mixing mechanism, and the discharge nozzle are integrated with one another.

6. The processing liquid generation mechanism according to claim 4, further comprising
   a third droplet dispersion mechanism to perform a third droplet generation process of supplying third gas to a third chemical liquid, and dispersing the third chemical liquid into droplets to acquire third chemical liquid droplets, wherein
   the droplet mixing mechanism performs the droplet mixing process of mixing at least the first chemical liquid droplets, the second chemical liquid droplets, and the third chemical liquid droplets to acquire the processing liquid in the form of droplets.

7. A semiconductor manufacturing apparatus comprising
   a processing mechanism including a processing liquid generation mechanism,
   the processing liquid generation mechanism including:
   a first droplet dispersion mechanism to perform a first droplet generation process of supplying first gas to a first chemical liquid, and dispersing the first chemical liquid into droplets to acquire first chemical liquid droplets;
   a second droplet dispersion mechanism to perform a second droplet generation process of supplying second gas to a second chemical liquid and dispersing the second chemical liquid into droplets to acquire second chemical liquid droplets;
   a droplet mixing mechanism to perform a droplet mixing process of mixing at least the first chemical liquid droplets and the second chemical liquid droplets to acquire a processing liquid in a form of droplets; and
   a discharge nozzle to perform a discharge process of externally discharging the processing liquid received from the droplet mixing mechanism;
   the processing mechanism to discharge the processing liquid generated using the processing liquid generation mechanism onto an upper surface of a semiconductor wafer.

8. The semiconductor manufacturing apparatus according to claim 7, wherein
   the processing liquid generation mechanism included in the processing mechanism further includes at least one temperature regulator located before at least one of the first droplet dispersion mechanism and the second droplet dispersion mechanism to perform a temperature regulation process of heating at least one of the first gas and the second gas so that a gas temperature regulation condition is met, and
   in the at least one of the first droplet dispersion mechanism and the second droplet dispersion mechanism before which the at least one temperature regulator is located, the gas temperature regulation condition is "TC<TG" where TC is temperature of at least one of the first chemical liquid and the second chemical liquid to be processed by the at least one of the first droplet dispersion mechanism and the second droplet dispersion mechanism, TG is temperature of the at least one of the first gas and the second gas.

9. A semiconductor manufacturing method performed using the semiconductor manufacturing apparatus according to claim 7, the semiconductor manufacturing method comprising the operations of:
- mounting the semiconductor wafer on a stage;
- supplying the first gas to the first droplet dispersion mechanism, and supplying the second gas to the second droplet dispersion mechanism;
- locating the discharge nozzle at a level taught from the upper surface of the semiconductor wafer;
- rotating the stage on which the semiconductor wafer is held at a set speed;
- supplying the first chemical liquid to the first droplet dispersion mechanism, and supplying the second chemical liquid to the second droplet dispersion mechanism;
- discharging the processing liquid acquired by the droplet mixing mechanism performing the droplet mixing process onto the upper surface of the semiconductor wafer through the discharge nozzle;
- stopping supply of the first chemical liquid and the second chemical liquid after an elapse of a set time period;
- locating the discharge nozzle at a standby position;
- stopping supply of the first gas and the second gas; and
- removing the semiconductor wafer from the stage.

* * * * *